United States Patent
Aram

(10) Patent No.: US 7,929,241 B1
(45) Date of Patent: Apr. 19, 2011

(54) SIGNAL CONVERSION SYSTEM AND METHOD

(75) Inventor: Farbod Aram, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/701,412

(22) Filed: Feb. 5, 2010

Related U.S. Application Data

(63) Continuation of application No. 10/832,900, filed on Apr. 26, 2004, now Pat. No. 7,667,916.

(51) Int. Cl.
G11B 5/02 (2006.01)

(52) U.S. Cl. ............. 360/67; 360/46; 360/65; 360/66; 360/68

(58) Field of Classification Search .......... None
See application file for complete search history.

(56) References Cited

U.S. PATENT DOCUMENTS

| | | | |
|---|---|---|---|
| 4,701,720 A * | 10/1987 | Monticelli | 330/260 |
| 4,755,766 A | 7/1988 | Metz | |
| 4,775,843 A * | 10/1988 | Wilcox | 330/260 |
| 4,794,317 A * | 12/1988 | van Tran | 323/316 |
| 4,835,489 A | 5/1989 | Monticelli | |
| 4,857,862 A | 8/1989 | Brokaw | |
| 5,030,856 A * | 7/1991 | Dansky et al. | 326/66 |
| 5,283,482 A * | 2/1994 | Chen | 326/66 |
| 5,424,658 A | 6/1995 | Sikkink et al. | |
| 5,453,708 A | 9/1995 | Gupta et al. | |
| 5,606,268 A * | 2/1997 | Van Brunt | 326/68 |
| 5,821,809 A * | 10/1998 | Boerstler et al. | 327/563 |
| 5,831,454 A * | 11/1998 | Keating | 326/126 |
| 6,002,299 A | 12/1999 | Thomsen | |
| 6,060,909 A | 5/2000 | Aipperspach et al. | |
| 6,107,887 A | 8/2000 | Zucker et al. | |
| 6,107,888 A | 8/2000 | Price, Jr. | |
| 6,177,832 B1 | 1/2001 | Durec et al. | |
| 6,218,823 B1 | 4/2001 | Keeth | |
| 6,252,432 B1 * | 6/2001 | Freitas | 327/65 |
| 6,329,878 B1 | 12/2001 | Edwards et al. | |
| 6,366,165 B1 | 4/2002 | Huijsing et al. | |
| 6,606,489 B2 | 8/2003 | Razavi et al. | |
| 6,710,959 B1 | 3/2004 | Iroaga | |
| 6,717,474 B2 * | 4/2004 | Chen et al. | 330/301 |
| 6,741,121 B2 | 5/2004 | Huber | |
| 6,803,825 B2 | 10/2004 | Chiou et al. | |
| 6,806,744 B1 | 10/2004 | Bell et al. | |
| 6,806,771 B1 | 10/2004 | Hildebrant et al. | |
| 6,819,142 B2 * | 11/2004 | Viehmann et al. | 326/127 |
| 6,822,512 B2 * | 11/2004 | Brokaw | 330/252 |
| 6,930,554 B2 | 8/2005 | Mondal et al. | |
| 6,958,872 B1 | 10/2005 | Cheng et al. | |
| 7,030,685 B1 * | 4/2006 | Aram | 327/538 |
| 7,116,164 B1 | 10/2006 | Aram | |

* cited by examiner

*Primary Examiner* — Dismery E Mercedes

(57) ABSTRACT

A signal conversion circuit includes: an input circuit that rejects common mode inputs and is configured to receive a differential input signal and shift a first bias of the differential input signal to produce a single ended intermediate signal with a second bias; and an amplifier circuit configured to amplify the single ended intermediate signal to produce an amplified signal. The input circuit can include: first and second transistors with drains configured to couple with a supply voltage, and gates of the first transistor and the second transistor are configured to receive the differential input signal; a first resistor coupled to a source of the first transistor and a drain of a third transistor; and a second resistor coupled to a source of the second transistor and a drain of a fourth transistor; where the third transistor and the fourth transistor are connected in a current mirror configuration.

14 Claims, 4 Drawing Sheets

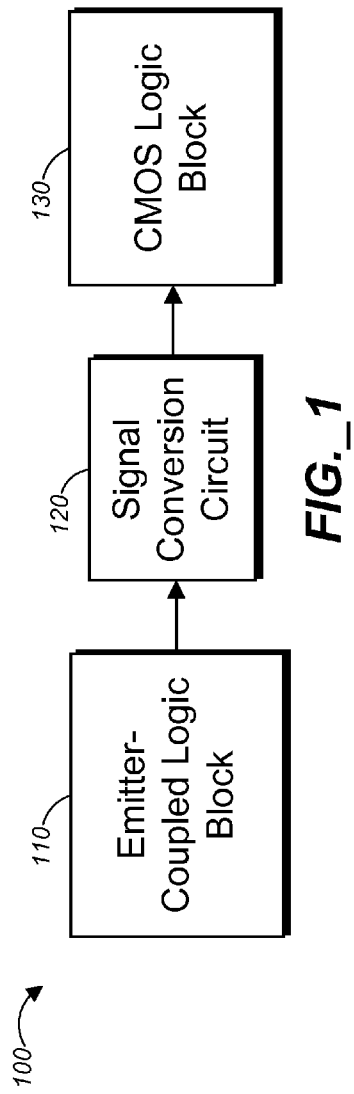
FIG._1
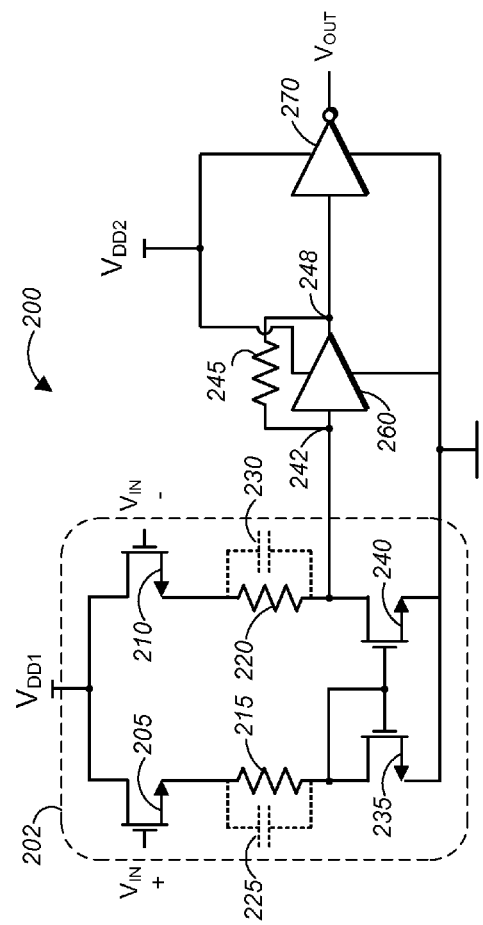
FIG._2

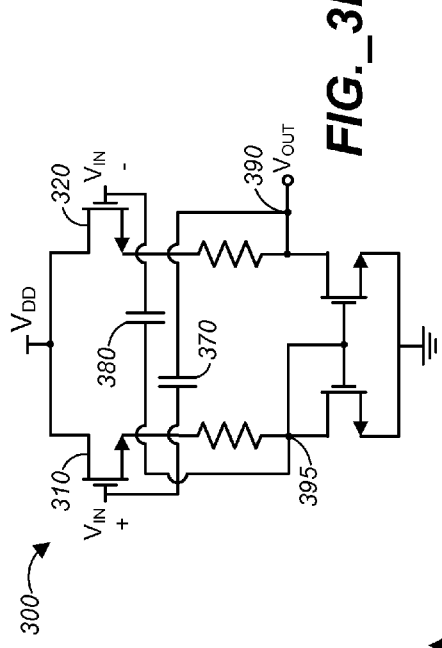
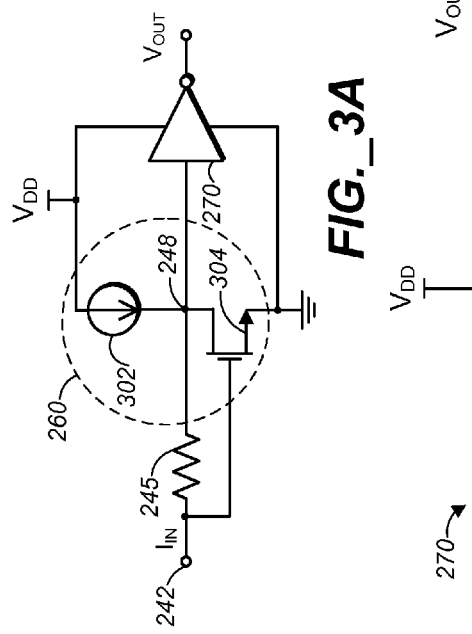
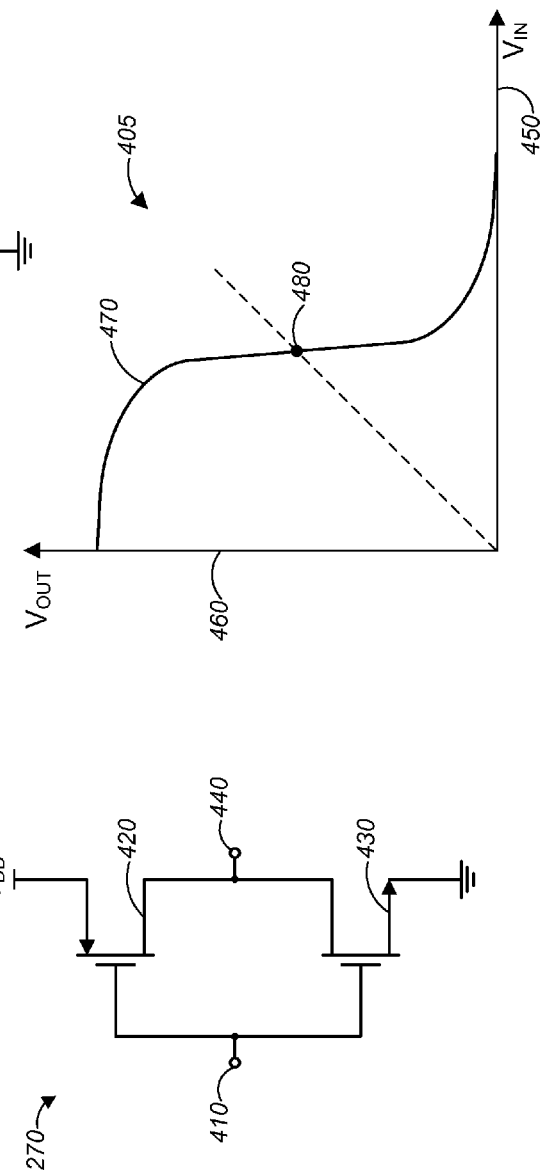

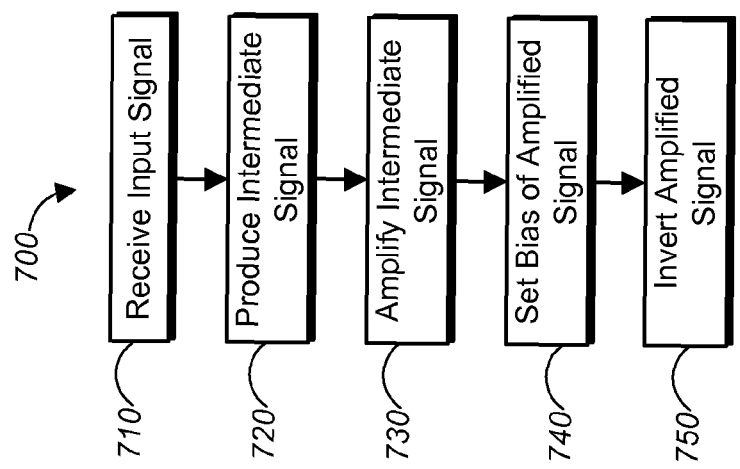
*FIG._7*
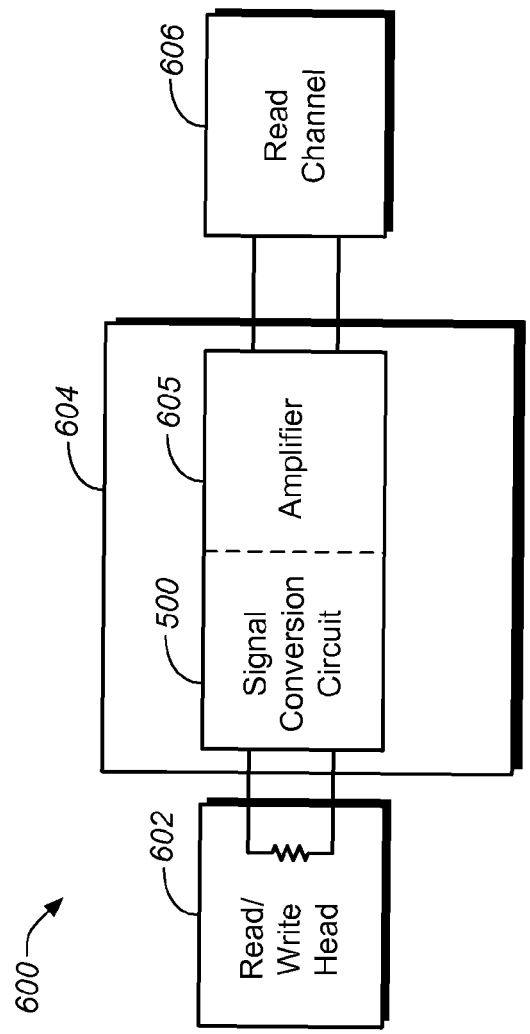
*FIG._6*

US 7,929,241 B1

SIGNAL CONVERSION SYSTEM AND METHOD

CROSS-REFERENCE TO RELATED APPLICATIONS

This application is a continuation application of and claims the benefit of priority to U.S. patent application Ser. No. 10/832,900, filed on Apr. 26, 2004, which is hereby incorporated by reference in its entirety.

BACKGROUND

The following disclosure relates to electrical circuits and signal processing.

An electrical circuit can be designed using two or more integrated-circuit (IC) technologies. For example, emitter-coupled logic (ECL) devices can be used in portions of a circuit that require high-speed operation, and complimentary metal-oxide semiconductor (CMOS) devices can be used in other portions of the circuit to save space and power. When multiple IC technologies are used in a circuit, a signal conversion circuit typically is used to interface between the different technologies.

A signal conversion circuit is used, for example, because an ECL circuit can receive a 5-volt supply voltage and produce a differential signal with a 700-millivolt swing. A CMOS circuit can receive a 3.3-volt supply voltage and produce a single-ended signal with a 1500-millivolt swing. A signal conversion circuit to convert a signal from ECL to CMOS typically converts the differential ECL signal to a single-ended signal and amplifies and shifts the level of the signal, producing a signal with voltages suitable for use in a CMOS circuit.

SUMMARY

In one aspect, an apparatus is provided for converting a signal. An input circuit receives a differential input signal and produces a single-ended intermediate signal. The input circuit boosts high-frequency components of the input signal substantially more than low-frequency components. An amplifier circuit receives the intermediate signal and produces an amplified signal, and a feedback path couples the amplified signal to the intermediate signal. An inverter circuit receives the amplified signal and produces an output signal.

In another aspect, an apparatus is provided for converting a signal that includes an input means, which receives a differential input signal and produces a single-ended intermediate signal, where the input means boosts high-frequency components of the input signal substantially more than low-frequency components. An amplifier means receives the intermediate signal and produces an amplified signal, and a feedback means couples the amplified signal to the intermediate signal. An inverter means receives the amplified signal and produces an output signal.

In yet another aspect, a method for converting a signal is provided. A differential input signal is received and high-frequency components of the input signal are boosted substantially more than low-frequency components to produce a single-ended intermediate signal. The intermediate signal is amplified to produce an amplified signal, and a bias of the amplified signal is set, which includes coupling the amplified signal to the intermediate signal. The amplified signal is inverted to produce an output signal.

In one aspect, a disk drive system is provided that includes a read head configured to sense changes in magnetic flux on the surface of a disk and generate a corresponding differential read signal. A preamplifier amplifies the read signal. The preamplifier includes a signal conversion circuit, which includes an input circuit that receives the read signal and produces a single-ended intermediate signal. The input circuit boosts high-frequency components of the read signal substantially more than low-frequency components. An amplifier circuit receives the intermediate signal and produces an amplified signal, and a feedback path couples the amplified signal to the intermediate signal. An inverter circuit receives the amplified signal and produces an output signal.

In another aspect, a disk drive system is provided that includes a sensing means for sensing changes in magnetic flux on the surface of a recording means. The sensing means generates a corresponding differential read signal. The disk drive system also includes a means for amplifying the read signal, which includes input means for receiving the read signal and producing a single-ended intermediate signal. The input means boosts high-frequency components of the read signal substantially more than low-frequency components. An amplifier means receives the intermediate signal and produces an amplified signal, and a feedback means couples the amplified signal to the intermediate signal. An inverter means receives the amplified signal and produces an output signal.

In one aspect, an apparatus for converting a signal is provided. An input circuit receives a differential input signal and produces a single-ended intermediate signal. An amplifier circuit receives the intermediate signal and produces an amplified signal, and a feedback path couples the amplified signal to the intermediate signal. An inverter circuit receives the amplified signal and produces an output signal. The apparatus also includes a voltage regulator circuit that supplies a first current to the amplifier circuit and a second current to the inverter circuit.

In another aspect, an apparatus for converting a signal is provided and includes an input means, which receives a differential input signal and produces a single-ended intermediate signal. An amplifier means receives the intermediate signal and produces an amplified signal, while a feedback means couples the amplified signal to the intermediate signal. An inverter means receives the amplified signal and produces an output signal. The apparatus also includes a voltage regulation means that supplies a first current to the amplifier means and a second current to the inverter means.

In yet another aspect, a method for converting a signal is provided. A differential input signal is received, and a single-ended intermediate signal representing the input signal is produced. The intermediate signal is amplified to produce an amplified signal, and a bias of the amplified signal is set. Setting the bias includes coupling the amplified signal to the intermediate signal. The amplified signal is inverted to produce an output signal, and the amplifying and the inverting are regulated.

In one aspect, a disk drive system is provided that includes a read head configured to sense changes in magnetic flux on the surface of a disk and generate a corresponding differential read signal. A preamplifier amplifies the read signal. The preamplifier includes a signal conversion circuit that includes an input circuit. The input circuit receives the read signal and produces a single-ended intermediate signal. An amplifier circuit receives the intermediate signal and produces an amplified signal, while a feedback path couples the amplified signal to the intermediate signal. An inverter circuit receives the amplified signal and produces an output signal. The signal conversion circuit also includes a voltage regulator circuit that supplies a first current to the amplifier circuit and a second current to the inverter circuit.

In another aspect, a disk drive system is provided that includes a sensing means, which senses changes in magnetic flux on the surface of a recording means and generates a corresponding differential read signal. The system includes a means for amplifying the read signal, which includes an input means for receiving the read signal and producing a single-ended intermediate signal. An amplifier means receives the intermediate signal and produces an amplified signal, while a feedback means couples the amplified signal to the intermediate signal. An inverter means receives the amplified signal and produces an output signal. The means for amplifying also includes a voltage regulation means that supplies a first current to the amplifier means and a second current to the inverter means.

Particular implementations may include one or more of the following features. The input circuit can include a capacitance that boosts the high-frequency components of the input signal. The feedback path can adjust a bias of the amplified signal to a bias at which the inverter circuit provides a greatest gain. The intermediate signal can have a bias that is different from a bias of the input signal. A size of the amplifier circuit can be substantially equal to a size of the inverter circuit.

The amplifier circuit can include a first PMOS transistor and a first NMOS transistor, where the drain of the first PMOS transistor is connected to the drain of the first NMOS transistor. The inverter circuit can include a second PMOS transistor and a second NMOS transistor, where the drain of the second PMOS transistor is connected to the drain of the second NMOS transistor, and a ratio of a width of the first PMOS transistor to a width of the first NMOS transistor can be substantially equivalent to a ratio of a width of the second PMOS transistor to a width of the second NMOS transistor.

The voltage regulator circuit can include a unity-feedback inverter circuit, where the unity-feedback inverter circuit includes a third PMOS transistor and a third NMOS transistor. The drain of the third PMOS transistor can be connected to the drain of the third NMOS transistor, and a ratio of a width of the third PMOS transistor to a width of the third NMOS transistor can be substantially equivalent to the ratio of the width of the first PMOS transistor to the width of the first NMOS transistor.

The voltage regulator circuit can include a current mirror that provides the first and second currents proportional to a third current that flows through the unity-feedback inverter circuit. One or more additional amplifier circuits can be coupled to the amplifier circuit, where the additional amplifier circuits amplify the amplified signal. One or more additional feedback paths can be coupled to the additional amplifier circuits. One or more additional inverter circuits can also be coupled to the amplifier circuit, where the one or more additional inverter circuits can invert the amplified signal. The input signal can be compatible with emitter-coupled logic, and the output signal can be compatible with CMOS logic.

Implementations can include one or more of the following advantages. An apparatus, method, and system are disclosed that can convert a signal to produce a converted signal with a desirable bandwidth and high gain. An inverter can be biased at a desired operating point even when process variations occur. Signals provided to the inverter can be biased at a level of greatest gain for the inverter. The apparatus, method, and system can be used to convert signals quickly and with little distortion.

These general and specific aspects may be implemented using an apparatus, a method, a system, or any combination of apparatus, methods, and systems.

The details of one or more implementations are set forth in the accompanying drawings and the description below. Other features and advantages will become apparent from the description, the drawings, and the claims.

BRIEF DESCRIPTION OF THE DRAWINGS

FIG. 1 is a block diagram of a signal conversion circuit interfacing two logic circuits.
FIG. 2 is a schematic of a signal conversion circuit.
FIG. 3A is a schematic of a circuit including a transimpedance amplifier with feedback.
FIG. 3B is a schematic of a differential input circuit.
FIG. 4A is a schematic of a logic inverter circuit.
FIG. 4B is a graph of the relationship between an input voltage and an output voltage of the inverter from FIG. 4A.
FIG. 6 is a block diagram of a disk drive system.
FIG. 7 is a flowchart of a process for converting a signal.
Like reference numbers and designations in the various drawings indicate like elements.

DETAILED DESCRIPTION

Figure 5:
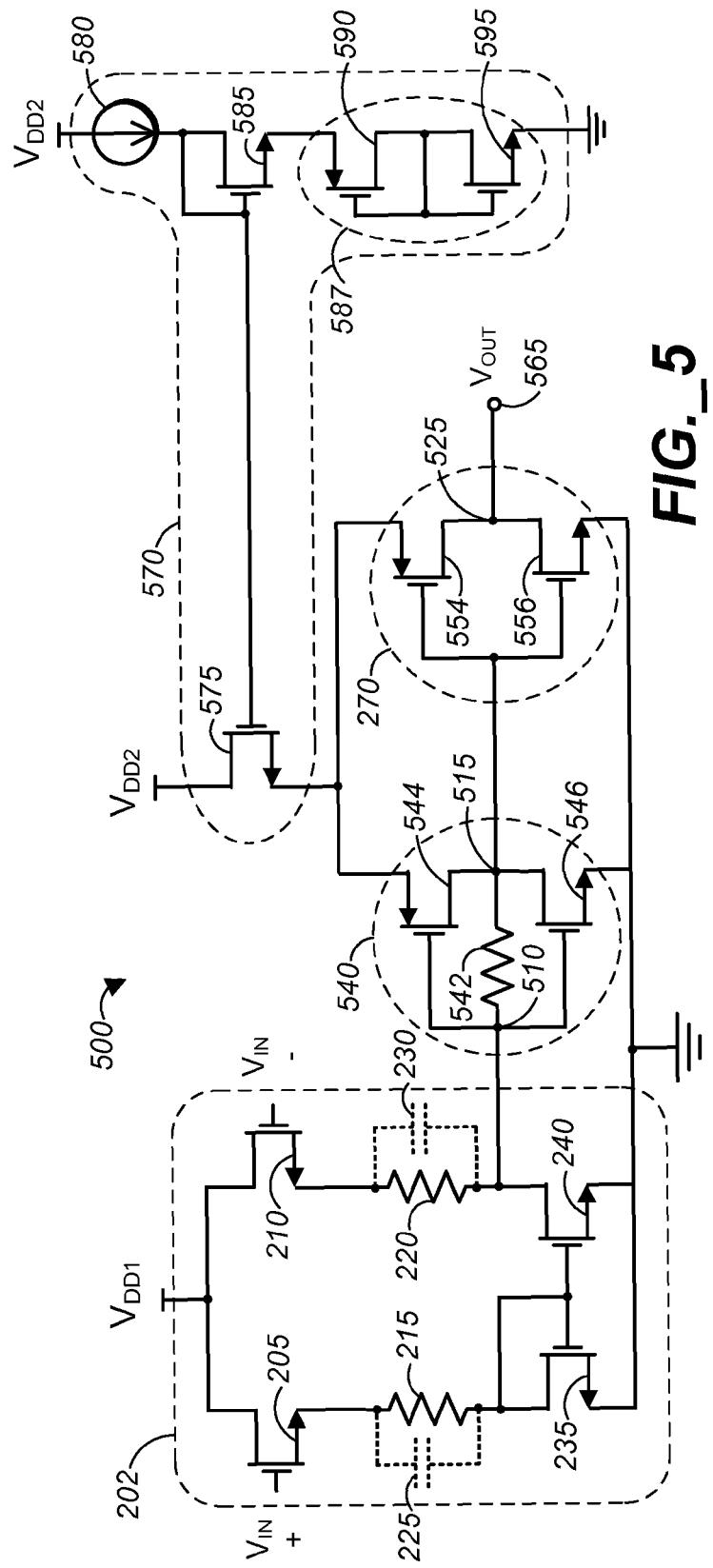
FIG. 5 is a schematic of a signal conversion circuit.

FIG. 1 shows a system 100 in which signals from an emitter-coupled logic (ECL) block 110 are converted, using a signal conversion circuit 120, into signals that can be used by a CMOS logic block 130. ECL block 110 and CMOS logic block 130 can be fabricated on a single silicon substrate, or can be fabricated on separate substrates.

For example, a differential signal can be transmitted from a first integrated-circuit (IC) chip to a second IC chip using an ECL driver circuit (e.g., ECL block 110), and the differential signal can be received by a signal conversion circuit on the second chip (e.g., signal conversion circuit 120). The signal conversion circuit can shift the level of the received differential signal, convert the differential signal to a single-ended signal, and amplify the single-ended signal. The resultant signal can then be used by CMOS logic block 130.

FIG. 2 is a schematic of a signal conversion circuit 200. An input circuit 202 receives a differential input signal in the form of a differential voltage at the gates of transistors 205 and 210. Transistors 205 and 210 convert the differential input signal into currents that flow through resistors 215 and 220. Transistors 235 and 240 are connected in a current-mirror configuration, so the currents flowing through transistors 235 and 240 are equal when transistors 235 and 240 are sized the same.

Input circuit 202 shifts the direct-current (DC) voltage level (bias) of the differential signal input to transistors 205 and 210 to create a single-ended intermediate signal at node 242. The input signal typically has a higher bias than the intermediate signal because the circuitry that supplies the input signal to input circuit 202 operates with a first supply voltage (e.g., 5 volts), while the circuitry that receives an output signal from signal conversion circuit 200 operates with a second, typically lower, supply voltage (e.g., 3.3 volts). In one implementation, the single-ended intermediate signal at node 242 has a bias of approximately $V_{DD2}/2$ volts.

Input circuit 202 also rejects common-mode inputs. If the same voltage is input to transistors 205 and 210, no current will flow through resistor 245. When a differential signal voltage is applied to input circuit 202, however, and the voltage at the gate of transistor 205 is higher than the voltage at the gate of transistor 210, more current will flow to ground through transistor 240 than flows through transistor 210. Current therefore will be sourced to input circuit 202. When the voltage at the gate of transistor 205 is lower than the voltage at the gate of transistor 210, less current will flow to ground through transistor 240 than flows through transistor 210, so current will be sunk from input circuit 202.

A transimpedance amplifier 260 (amplifier 260) amplifies the intermediate signal at node 242 to produce a signal at node 248. A feedback path is provided for amplifier 260 by resistor 245 as will be discussed in detail below. An inverter 270 receives the signal from amplifier 260 and inverts the signal to produce an output signal ($V_{OUT}$) of signal conversion circuit 200. In one implementation, signal conversion circuit 200 includes more inverters (e.g., inverter 270) and amplifiers with feedback (e.g., amplifier 260 with resistor 245) between node 248 and inverter 270 to amplify the signal at node 248.

A gain provided by signal conversion circuit 200 from the gates of transistors 205 and 210 to node 248 is inversely proportional to the resistance of resistors 215 and 220. The gain provided by signal conversion circuit 200 can be increased for high-frequency signals by placing a capacitor 225 in parallel with resistor 215 and by placing a capacitor 230 in parallel with resistor 220. Capacitors 225 and 230 provide a low-resistance path to bypass resistors 215 and 220 at high frequencies, increasing the gain of signal conversion circuit 200.

FIG. 3A shows an implementation of amplifier 260 including a transistor 304 and a current source 302. An input current is applied at a terminal 242 and flows through a feedback resistor 245. Amplifier 260 produces an intermediate signal at a node 248, and resistor 245 sets the bias of the intermediate signal at node 248. For example, the bias of the intermediate signal at node 248 can be set to correspond to a point of greatest gain of an inverter 270. Inverter 270 receives the intermediate signal at node 248 and inverts the intermediate signal to produce an output signal ($V_{OUT}$).

FIG. 3B shows an alternative input circuit 300 that can be used in a signal conversion circuit. Input circuit 300 performs the same functions as input circuit 202 (FIG. 2)—converting a differential input signal into a single-ended intermediate signal, rejecting common-mode signals, and shifting the bias of the input signal to create the intermediate signal. Input circuit 300 includes a capacitor 370 connecting the gate of a transistor 310 to a node 390. Input circuit 300 also includes a capacitor 380 connecting the gate of a transistor 320 to a node 395. When a low-frequency differential signal is applied to transistors 310 and 320, input circuit 300 operates substantially the same as input circuit 202 (FIG. 2). When a high-frequency differential signal is applied to transistors 310 and 320, capacitors 370 and 380 provide a low-resistance path to nodes 390 and 395, respectively.

FIG. 4A shows an implementation of inverter circuit 270 (FIG. 2). The drain of a PMOS transistor 420 is connected to the drain of an NMOS transistor 430. An input voltage at terminal 410 is provided to the gates of transistors 420 and 430, and an output voltage is produced at terminal 440.

Referring to FIG. 4A and FIG. 4B, graph 405 shows the voltage characteristics of inverter 270. A curve 470 shows the relationship between the input voltage at terminal 410 (plotted along an axis 450) and the output voltage at terminal 440 (plotted along an axis 460). The voltage gain between terminal 410 and terminal 440 for a small alternating-current (AC) voltage is proportional to the slope of curve 470 at the operating point of inverter 270. Accordingly, inverter 270 amplifies an AC voltage at terminal 410 by the greatest amount when the operating point of inverter 270 is at a point 480 on curve 470. As discussed above, amplifier 260 and feedback resistor 245 (FIG. 3A) provide optimal biasing of inverter 270.

FIG. 5 shows an alternative signal conversion circuit 500. An input circuit 202 converts a differential input signal into a single-ended intermediate signal while shifting the bias of the input signal and rejecting common-mode input signals as was discussed above in the context of FIG. 2. A voltage regulator 570 controls the current flowing through a transimpedance amplifier with feedback 540 (hereafter amplifier 540) and an inverter 270.

Amplifier 540 sets the bias of a signal at a node 515. Amplifier 540 includes a PMOS transistor 544 and an NMOS transistor 546, and amplifies an AC signal at a node 510 to produce an AC signal at node 515. A resistor 542 provides a feedback path between node 515 and node 510 to set the bias of the signal at node 515. The signal at node 515 can be biased, for example, at a point of greatest gain (e.g., point 480 in FIG. 4B) for inverter 270. In one implementation, transistors 544 and 546 are matched by appropriately sizing the widths of the respective transistors.

Inverter 270 includes a PMOS transistor 554 and an NMOS transistor 556. In one implementation, the widths of transistors 554 and 556 are sized such that transistors 554 and 556 are matched transistors, and the ratio of the width of transistor 554 to the width of transistor 556 is the same as the ratio of the width of transistor 544 to the width of transistor 546. In this implementation, an AC signal at node 515 is amplified by the maximum gain of inverter 270 to produce an output signal ($V_{OUT}$) at node 565.

Referring to voltage regulator 570, a current source 580 provides a current to a transistor 585. Transistor 585 and a transistor 575 form a current mirror. Transistor 575 can be sized differently than transistor 585 to scale the current flowing through transistor 575 relative to the current flowing through transistor 585. A transistor 590 and a transistor 595 are configured to form a unity-feedback inverter 587. Because inverter 587 is a unity-feedback inverter, the input voltage and the output voltage of inverter 587 are equal, and inverter 587 is biased to operate at the point of the greatest gain (e.g., point 480 in FIG. 4B).

When the ratio of the width of transistor 590 to the width of transistor 595 is the same as the ratio of the width of transistor 544 to the width of transistor 546 and is also the same as the ratio of the width of transistor 554 to the width of transistor 556, the current flowing through amplifier 540 and inverter 270 is proportional to the current flowing through inverter 587. By matching the ratios between the widths of the upper transistors and the widths of the lower transistors in amplifier 540 and inverters 270 and 587, the current flowing through each inverter biases each inverter at the point of greatest gain (e.g., point 480 in FIG. 4B) and biases amplifier 540 such that the signal at node 515 is biased at a point of greatest gain for inverter 270. The structure proposed, including voltage regulator 570, allows for the biasing of amplifier 540 and inverters 270 and 587 at a point irrespective of process variations.

One or more amplification stages (e.g., amplifier 540) are used to amplify the single-ended AC output of input circuit 202 into an AC signal at node 515. In one implementation, one or more inverters and/or amplifiers with feedback are included between amplifier 540 and inverter 270. For example, one or more copies of amplifier 540 and inverter 270 can be placed between amplifier 540 and inverter 270 to amplify the signal at node 515 further before providing the signal to inverter 270.

Signal conversion circuit 500 can be employed in a wide range of applications, for example, in a preamplifier in a disk drive system 600, as shown in FIG. 6. Disk drive system 600 can include a read/write head 602, a preamplifier 604, a read channel 606, and a variety of disk control circuitry (not shown) to control the operation of a hard disk drive. Preamplifier 604 includes a signal conversion circuit (e.g., signal conversion circuit 500) and an amplifier 605. Preamplifier 604 may be implemented as a single integrated circuit or as separate integrated circuits and can include a separate read preamplifier and write preamplifier (or write driver).

In a read operation, an appropriate sector of a disk (not shown) is located and data that was previously written to the disk is detected. Read/write head 602 senses changes in magnetic flux and generates a corresponding read signal. Preamplifier 604 receives and amplifies the read signal. The amplified read signal is provided to read channel 606. Read channel 606 conditions the amplified read signal. Read channel 606 can condition the amplified read signal by further amplifying the read signal to an appropriate level using, for example, automatic gain control (AGC) techniques. Read channel 606 can filter the amplified read signal to eliminate unwanted high frequency noise, perform data recovery, and format the read signal. The read signal can be transferred from read channel 606 and stored in memory (not shown).

FIG. 7 shows a process 700 for converting a signal.

An input signal is received (step 710), for example, from an ECL circuit. An intermediate signal is produced (step 720) that differs from the input signal. If the input signal is a differential signal, the intermediate signal can be a single-ended signal, and if the input signal is single-ended, the intermediate signal can be differential. The bias of the intermediate signal can be different than the bias of the input signal. The intermediate signal can be a level-shifted single-ended representation of the input signal.

The intermediate signal is amplified (step 730) (e.g., by amplifier 540 in FIG. 5), and the bias of the amplified signal is set (step 740). To set the bias of the amplified signal, the amplified signal can be coupled to the intermediate signal, for example, by connecting nodes where the signals are present (e.g., with resistor 542 in FIG. 5). Finally, the amplified signal is inverted (step 750) to produce an output signal (e.g., a CMOS-compatible signal).

Various implementations have been described. These and other implementations are within the scope of the following claims.

What is claimed is:

1. A signal conversion circuit, comprising:
   an input circuit configured to receive a differential input signal and shift a first bias of the differential input signal to produce a single ended intermediate signal with a second bias, where the input circuit rejects common mode inputs; and
   an amplifier circuit, coupled with the input circuit, the amplifier circuit configured to amplify the single ended intermediate signal to produce an amplified signal;
   where the input circuit includes:
      a first transistor and a second transistor, where drains of the first transistor and the second transistor are configured to couple with a supply voltage, and gates of the first transistor and the second transistor are configured to receive the differential input signal;
      a first resistor coupled to a source of the first transistor and a drain of a third transistor; and
      a second resistor coupled to a source of the second transistor and a drain of a fourth transistor;
      where the third transistor and the fourth transistor are connected in a current-mirror configuration.

2. The circuit of claim 1, where the amplifier circuit is coupled to a feedback path that couples the amplified signal with the single ended intermediate signal.

3. The circuit of claim 1, further comprising:
   a first capacitor coupled in parallel to the first resistor and a second capacitor coupled in parallel to the second resistor, where the first and second capacitors increase the amplification at high frequencies.

4. The circuit of claim 1, further comprising:
   an inverter circuit that receives the amplified signal and produces an output signal.

5. The circuit of claim 4, where the differential input signal is compatible with emitter coupled logic and the output signal is compatible with complimentary metal-oxide semiconductor (CMOS) logic.

6. The circuit of claim 1, where the first bias and the second bias are direct current (DC) voltage levels, and the first bias is greater than the second bias.

7. A method, comprising:
   receiving, at an input circuit, a differential input signal, where the receiving includes rejecting common mode inputs;
   shifting, at the input circuit, a first bias of the differential input signal to produce a single ended intermediate signal with a second bias; and
   amplifying, at an amplifier circuit, the single ended intermediate signal to produce an amplified signal;
   where the receiving includes receiving the differential input signal across gates of a first transistor and a second transistor, where drains of the first transistor and the second transistor are configured to couple with a supply voltage; and
   where the shifting includes converting the differential input signal into current signals at sources of the first transistor and the second transistor, where a first resistor is coupled to the source of the first transistor and a drain of a third transistor, a second resistor is coupled to the source of the second transistor and a drain of a fourth transistor, and the third transistor and the fourth transistor are connected in a current mirror configuration.

8. The method of claim 7, further comprising:
   capacitatively filtering the differential input signal to increase the amplification at high frequencies.

9. The method of claim 7, further comprising:
   inverting the amplified signal to produce an output signal.

10. The method of claim 9, where the differential input signal is compatible with emitter coupled logic and the output signal is compatible with complimentary metal-oxide semiconductor (CMOS) logic.

11. The method of claim 7, where the first bias and the second bias are direct current (DC) voltage levels, and the first bias is greater than the second bias.

12. A system comprising:
   emitter coupled logic that produces a differential signal;
   a signal conversion circuit configured to:
      receive the differential signal and reject a common mode,
      shift a first bias of the differential signal to produce a single ended intermediate signal with a second bias,
      amplify the single ended intermediate signal to produce an amplified signal, and
      invert the amplified signal to produce an output signal; and
   complimentary metal-oxide semiconductor (CMOS) logic that receives the output signal as a compatible input;
   where the signal conversion circuit is configured to:
      receive the differential signal across gates of a first transistor and a second transistor, where drains of the first transistor and the second transistor are configured to couple with a supply voltage, and shift the first bias of the differential signal by converting the differential signal into current signals at sources of the first transistor and the second transistor, where a first resistor is coupled to the source of the first transistor and a drain of a third transistor, a second resistor is coupled to the source of the second transistor and a drain of a fourth transistor, and the third transistor and fourth transistor are connected in a current mirror configuration.

13. The system of claim 12, where the signal conversion circuit is further configured to capacitatively filter the differential signal to increase the amplification at high frequencies.

14. The system of claim 12, where the first bias and the second bias are direct current (DC) voltage levels, and the first bias is greater than the second bias.

* * * * *